(12) United States Patent
Liu et al.

(10) Patent No.: US 10,943,837 B2
(45) Date of Patent: *Mar. 9, 2021

(54) DEVICE HAVING OVERLAPPING SEMICONDUCTOR FINS ORIENTED IN DIFFERENT DIRECTIONS

(71) Applicant: STMicroelectronics, Inc., Coppell, TX (US)

(72) Inventors: Qing Liu, Irvine, CA (US); John H. Zhang, Altamont, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/399,808

(22) Filed: Apr. 30, 2019

(65) Prior Publication Data

US 2019/0259673 A1    Aug. 22, 2019

Related U.S. Application Data

(60) Continuation of application No. 15/890,001, filed on Feb. 6, 2018, now Pat. No. 10,319,647, which is a
(Continued)

(51) Int. Cl.
*H01L 27/12* (2006.01)
*H01L 29/06* (2006.01)
(Continued)

(52) U.S. Cl.
CPC .......... *H01L 21/845* (2013.01); *H01L 21/266* (2013.01); *H01L 21/26513* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 5,470,776 A    11/1995  Ryou
5,567,959 A    10/1996  Mineji
(Continued)

OTHER PUBLICATIONS

Liu et al., "Silicon Germanium-On-Insulator FinFet," U.S. Appl. No. 14/588,116, filed Dec. 31, 2014, 30 pages.
(Continued)

*Primary Examiner* — Younes Boulghassoul
(74) *Attorney, Agent, or Firm* — Seed IP Law Group LLP

(57) ABSTRACT

An analog integrated circuit is disclosed in which short channel transistors are stacked on top of long channel transistors, vertically separated by an insulating layer. With such a design, it is possible to produce a high density, high power, and high performance analog integrated circuit chip including both short and long channel devices that are spaced far enough apart from one another to avoid crosstalk. In one embodiment, the transistors are FinFETs and the long channel devices are multi-gate FinFETs. In one embodiment, single and dual damascene devices are combined in a multi-layer integrated circuit cell. The cell may contain various combinations and configurations of the short and long-channel devices. A high density cell can be made by simply shrinking the dimensions of the cells and replicating two or more cells in the same size footprint as the original cell.

23 Claims, 18 Drawing Sheets

Related U.S. Application Data continuation of application No. 15/238,559, filed on Aug. 16, 2016, now Pat. No. 9,917,020, which is a division of application No. 14/788,341, filed on Jun. 30, 2015, now Pat. No. 9,425,213.

(51) Int. Cl.

| | | |
|---|---|---|
| *H01L 29/10* | (2006.01) | |
| *H01L 27/02* | (2006.01) | |
| *H01L 27/06* | (2006.01) | |
| *H01L 27/088* | (2006.01) | |
| *H01L 29/161* | (2006.01) | |
| *H01L 29/423* | (2006.01) | |
| *H01L 21/84* | (2006.01) | |
| *H01L 21/266* | (2006.01) | |
| *H01L 21/265* | (2006.01) | |
| *H01L 21/308* | (2006.01) | |
| *H01L 29/66* | (2006.01) | |

(52) U.S. Cl.
CPC ...... *H01L 21/3081* (2013.01); *H01L 27/0207* (2013.01); *H01L 27/0688* (2013.01); *H01L 27/0886* (2013.01); *H01L 27/1211* (2013.01); *H01L 29/0615* (2013.01); *H01L 29/0649* (2013.01); *H01L 29/0657* (2013.01); *H01L 29/1033* (2013.01); *H01L 29/1037* (2013.01); *H01L 29/161* (2013.01); *H01L 29/4236* (2013.01); *H01L 29/66795* (2013.01)

(58) Field of Classification Search
CPC ........... H01L 27/1211; H01L 27/10826; H01L 27/10879; H01L 29/41791; H01L 29/66795–66818; H01L 29/785–7856; H01L 29/42384–42392; H01L 29/0673; H01L 27/0688; H01L 27/0207; H01L 29/0603; H01L 29/0649; H01L 29/0657; H01L 29/0692; H01L 29/0696; H01L 29/1033; H01L 29/1037
See application file for complete search history.

(56) References Cited

U.S. PATENT DOCUMENTS

| | | | |
|---|---|---|---|
| 5,612,552 | A | 3/1997 | Owens |
| 5,808,319 | A | 9/1998 | Gardner et al. |
| 5,852,310 | A | 12/1998 | Kadosh et al. |
| 6,201,267 | B1 | 3/2001 | Gupta et al. |
| 6,429,484 | B1 | 8/2002 | Yu |
| 6,867,460 | B1 * | 3/2005 | Anderson ............. H01L 21/845 257/351 |
| 7,719,033 | B2 | 5/2010 | Jeong et al. |
| 7,723,192 | B2 | 5/2010 | Carter et al. |
| 8,183,630 | B2 | 5/2012 | Batude et al. |
| 9,425,213 | B1 * | 8/2016 | Liu ................... H01L 29/66795 |
| 9,515,185 | B2 | 12/2016 | Liu et al. |
| 10,319,647 | B2 * | 6/2019 | Liu ................... H01L 29/66795 |
| 2004/0245577 | A1 | 12/2004 | Bhattacharyya |
| 2007/0034971 | A1 * | 2/2007 | Anderson ........... H01L 27/1211 257/401 |
| 2007/0181880 | A1 | 8/2007 | Kim |
| 2009/0001470 | A1 * | 1/2009 | Anderson ........... H01L 27/1211 257/351 |
| 2009/0294857 | A1 * | 12/2009 | Lee ................... H01L 27/10876 257/365 |
| 2011/0134683 | A1 * | 6/2011 | Yamazaki ............. G11C 11/405 365/149 |
| 2012/0126326 | A1 * | 5/2012 | Wang .............. H01L 21/823431 257/365 |
| 2013/0200365 | A1 | 8/2013 | Yamazaki |
| 2015/0123203 | A1 | 5/2015 | Lin et al. |
| 2015/0214341 | A1 * | 7/2015 | Shin ..................... H01L 29/785 257/401 |
| 2015/0279970 | A1 | 10/2015 | Zhang |
| 2015/0325575 | A1 * | 11/2015 | Park ..................... H01L 29/165 257/401 |
| 2016/0190304 | A1 | 6/2016 | Morin et al. |
| 2016/0276350 | A1 | 9/2016 | Zang et al. |
| 2018/0158737 | A1 * | 6/2018 | Kim ....................... H01L 29/78 |

OTHER PUBLICATIONS

Morin et al., "Defect-Free Strain Relaxed Buffer Layer," U.S. Appl. No. 14/588,221, filed Dec. 31, 2014, 30 pages.

Zhang, "SOI FinFET Transistor With Strained Channel," U.S. Appl. No. 14/231,466, filed Mar. 31, 2014, 35 pages. (Corresponds to published App. 2015/0279970).

* cited by examiner

DEVICE HAVING OVERLAPPING SEMICONDUCTOR FINS ORIENTED IN DIFFERENT DIRECTIONS

RELATED APPLICATIONS

This application claims the benefit of and the priority from U.S. patent application Ser. No. 15/890,001, filed on Feb. 6, 2018, now issued, which is a continuation application of U.S. patent application Ser. No. 15/238,559, filed on Aug. 16, 2016, now issued, which is a divisional application of and claims the priority from U.S. patent application Ser. No. 14/788,341, filed on Jun. 30, 2015, now issued, which are all incorporated herein by reference for all purposes as if fully set forth herein.

BACKGROUND

Technical Field

The present disclosure generally relates to advanced transistor structures for use in analog integrated circuits.

Description of the Related Art

Advanced integrated circuits typically feature strained channel devices, silicon-on-insulator (SOI) substrates, FinFET structures, or combinations thereof, in order to continue scaling transistor gate lengths below 20 nm. Such technologies allow the channel length of the transistor to be made smaller while minimizing detrimental consequences such as current leakage and other short channel effects.

A FinFET is an electronic switching device that features a conduction channel in the form of a semiconducting fin that extends outward from the substrate surface. In such a device, the gate, which controls current flow in the fin, wraps around three sides of the fin so as to influence current flow from three surfaces instead of one. The improved control achieved with a FinFET design results in faster switching performance in the "on" state and less current leakage in the "off" state than is possible in a conventional planar device.

Incorporating strain into the channel of a semiconductor device stretches the crystal lattice, thereby increasing charge carrier mobility in the channel so that the device becomes a more responsive switch. Introducing compressive strain into a PFET transistor tends to increase hole mobility in the channel, resulting in a faster switching response to changes in voltage applied to the transistor gate. Likewise, introducing a tensile strain into an NFET transistor tends to increase electron mobility in the channel, also resulting in a faster switching response.

There are many ways to introduce strain into the channel region of a FinFET. Techniques for introducing strain typically entail incorporating into the device epitaxial layers of one or more materials having crystal lattice dimensions or geometries that differ slightly from those of the silicon substrate. The epitaxial layers can be made of doped silicon or silicon germanium (SiGe), for example. Such epitaxial layers can be incorporated into source and drain regions, or into the transistor gate that is used to modulate current flow in the channel, or into the channel itself, which is the fin. Alternatively, strain can be induced in the fin from below the device by using various types of SOI substrates. An SOI substrate features a buried insulator, typically a buried oxide layer (BOX) underneath the active area. SOI FinFET devices have been disclosed in patent applications assigned to the present assignee, for example, U.S. patent application Ser. No. 14/231,466, entitled "SOI FinFET Transistor with Strained Channel," U.S. patent application Ser. No. 14/588,116, entitled "Silicon Germanium-on-insulator FinFET," and U.S. patent application Ser. No. 14/588,221, entitled "Defect-Free Strain-Relaxed Buffer Layer," all of which are hereby incorporated by reference in their entireties.

Short channel transistors in which the source and drain regions are very close together permit high speed switching, but they are generally less reliable and offer less precise control than long channel devices. Generally, it is desirable to have both short channel and long channel devices available on the same chip, e.g., as discussed in U.S. Pat. No. 7,723,192 to Carter et al. While it is relatively straightforward to include both types of devices in a digital integrated circuit, state-of-the-art analog designs pose a particular challenge. In order to prevent electromagnetic interference among the transistors on an analog chip, it is desirable to maintain some distance between neighboring devices. This limits the ability of circuit designers to shrink analog designs with each new technology generation. Prevention of crosstalk is of particular concern in nanoscale technologies, for which typical short channel lengths are now expected to be as low as about 7 nm.

BRIEF SUMMARY

An analog integrated circuit stacks short channel transistors on top of long channel transistors, vertically separated by an insulating layer. With such a design, it is possible to produce a high density, high power, and high performance analog integrated circuit chip including both short and long channel devices that are spaced far enough apart from one another to avoid crosstalk. In one embodiment, the transistors are FinFETs and, in particular, the long channel devices are multi-gate FinFETs. In one embodiment, single and dual damascene devices are combined in a multi-layer integrated circuit cell. The cell may contain various combinations and configurations of the short and long-channel devices. For example, one embodiment of a cell may contain two long channel devices and one short channel device, or two short channel devices co-linear with one long channel device. Another embodiment of a cell may contain two long channel and two short channel devices. A high density cell can be made by simply shrinking the dimensions of the cells and replicating two or more cells in the same size footprint as the original cell.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

DETAILED DESCRIPTION

Figure 1:
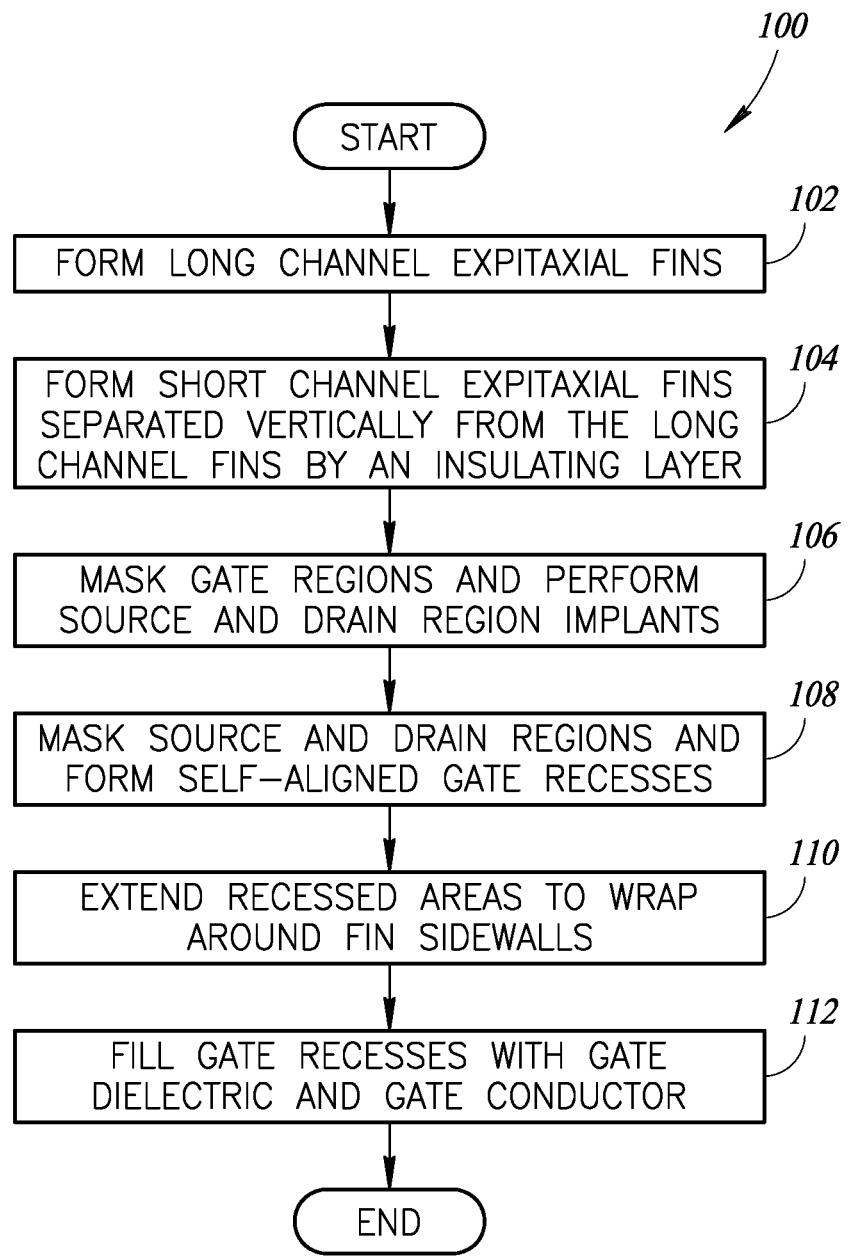
FIG. 1 is a flow diagram outlining a basic sequence of steps in a method of fabricating an integrated circuit cell that integrates short channel and long channel devices for analog circuit applications.
Figure 2A:
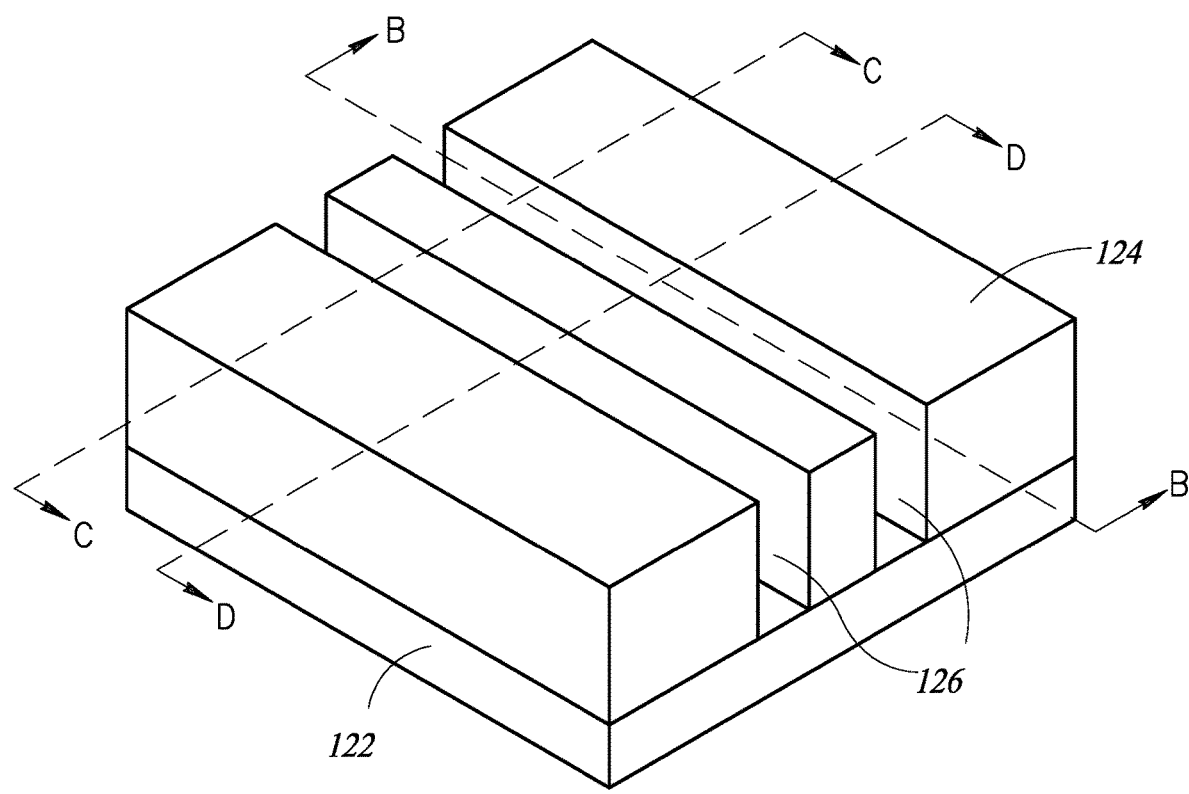
FIGS. 2A-2D show a perspective view and three different cross-sectional views of the integrated circuit cell after forming trenches for the long channel fins.
Figure 2B:
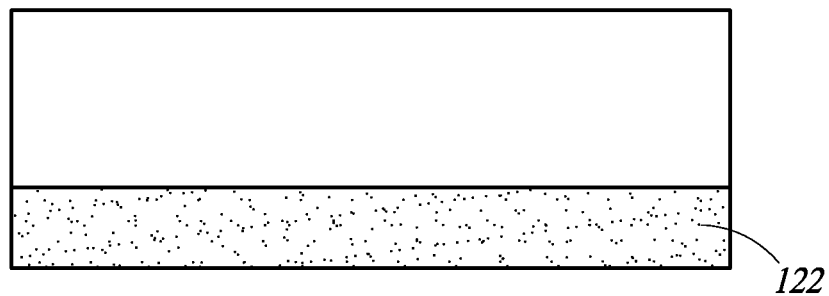
Figure 2C:
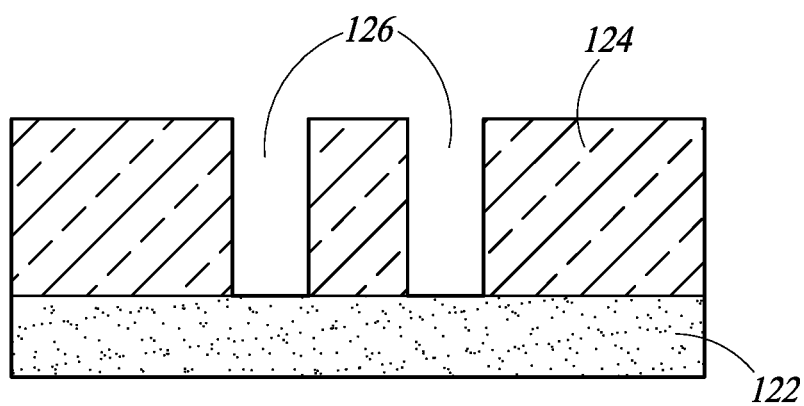
Figure 2D:
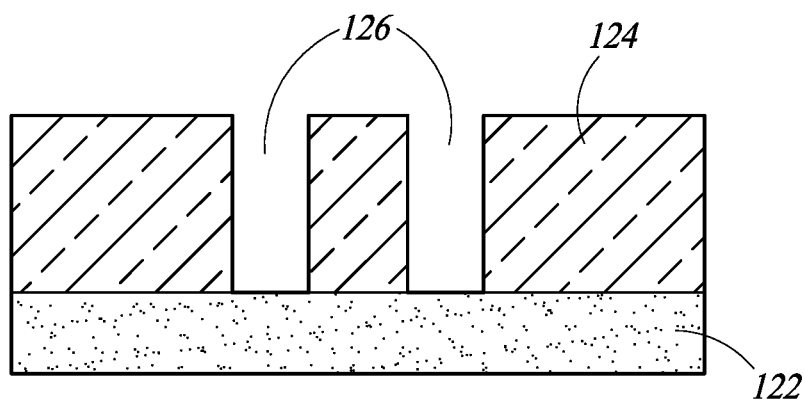

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to short channel and long channel FinFETs that have been produced; however, the present disclosure and the reference to certain materials, dimensions, and the details and ordering of processing steps are exemplary and should not be limited to those shown.

Turning now to the figures, FIG. 1 shows steps in a method of fabricating stacked short and long channel FinFETs for high performance analog integrated circuits, according to one embodiment. Steps in the method 100 are further illustrated by FIGS. 2A-8D, and described below. In each of the Figures, A is a perspective view of an integrated short and long channel cell at the present step during fabrication, showing, as an example, a single short channel and a pair of long channels, indicating cut lines for various cross-sectional views; B is a cross-sectional view along a cut line through an exemplary long channel; C is a cross-sectional view along a cut line across the pair of exemplary long channels; and D is a cross-sectional view along a cut line through the exemplary short channel.

At 102, long channel epitaxial fins of an integrated short and long channel cell 120 are formed on a silicon substrate 122, according to one embodiment. FIGS. 2A-2D show long channel trenches 126 formed by a damascene process in a blanket first insulating layer 124 formed on the silicon substrate 122. The first insulating layer 124 desirably is a high quality furnace-grown oxide of thickness 80-120 nm such as those typically used to form a buried oxide (BOX) layer. Alternatively, a silicon-on-insulator (SOI) wafer can be used, which is supplied with a BOX layer already formed.

SOI wafers are standard starting materials commonly used in the semiconductor industry.

The long channel trenches 126 formed in the first insulating layer 124 define the dimensions of the long channels such that the long channels will have widths in the range of about 5-20 nm, desirably between 7-10 nm, and a center-to-center separation, or pitch, within the range of about 34-48 nm, desirably about 44 nm. The long channel trenches 126 can be formed by a reactive ion etching (RIE) process that removes selected portions of the first insulating layer 124 and stops on the underlying silicon substrate 122.

Epitaxial silicon is then grown in the long channel trenches 126 to form long channel epitaxial fins 128, shown in FIGS. 3A-3D. The epitaxial silicon can be lightly doped in-situ to increase mobility of charge carriers that will traverse the long channel epitaxial fins 128 during operation of the integrated short and long channel cell 120. The long channel epitaxial fins 128 are then planarized using a conventional chemical-mechanical planarization (CMP) process that stops on the first insulating layer 124.

Next, a second insulating layer 130 is deposited over the long channel epitaxial fins 128, as shown in FIGS. 3A-3D. The second insulating layer 130 is desirably 100-160 nm thick, but otherwise may be similar to the first insulating layer 124. The second insulating layer 130 will provide vertical separation to electrically isolate the long channel epitaxial fins 128 from short channel epitaxial fins that will be formed subsequently.

At 104, a short channel epitaxial fin 138 and long channel source and drain regions 137, 139 are formed according to one embodiment, as shown in FIGS. 4A-4D. The short channel epitaxial fin 138 is formed in an orientation transverse to the long channel epitaxial fins 128 and is separated vertically from the long channel epitaxial fins by the second insulating layer 130. In one embodiment, the long channel and short channel epitaxial fins 128 and 138, respectively, are substantially orthogonal to one another as shown in various perspective views of the integrated short channel and long channel cell 120 presented herein.

Figure 3A:
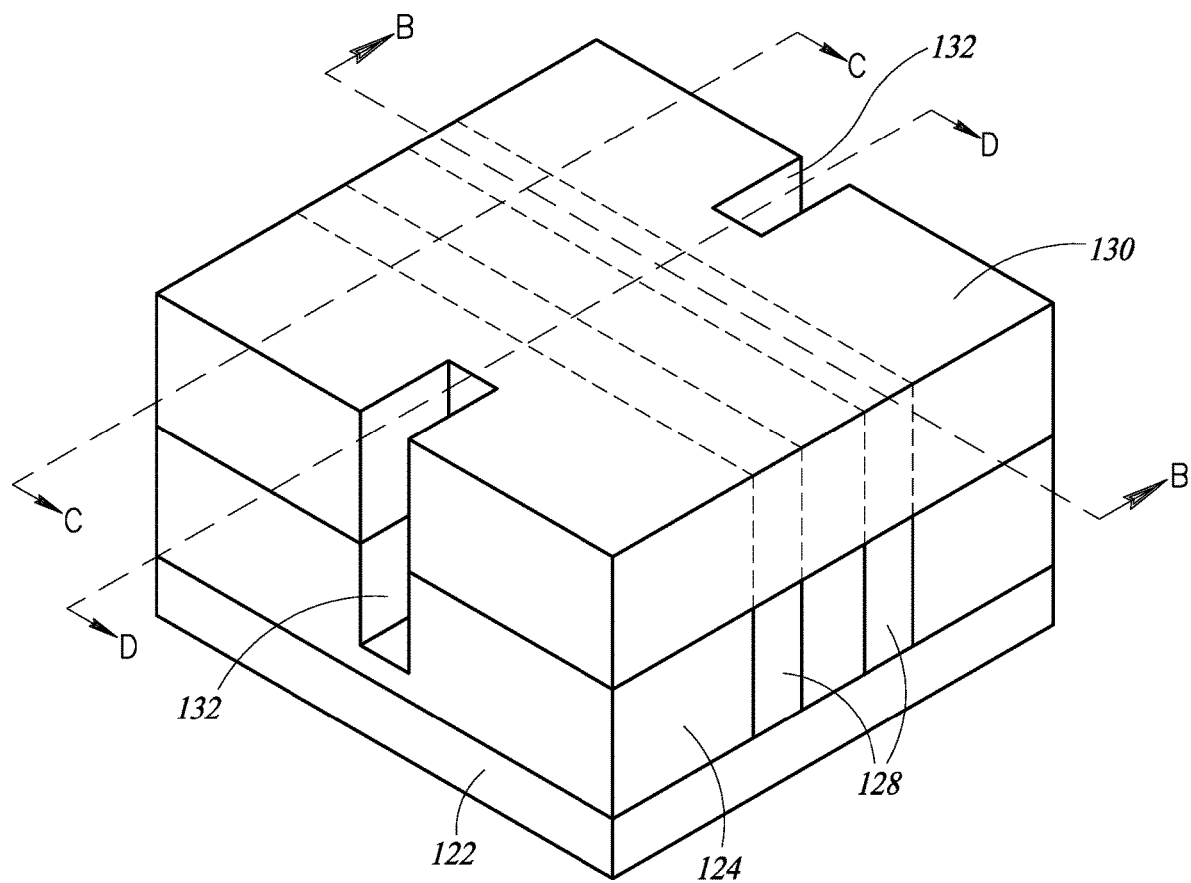
FIGS. 3A-3D show and a perspective view and three different cross-sectional views of the integrated circuit cell following epitaxial growth of the long-channel fins and formation of an insulating layer covering the long channel fins.
Figure 3B:
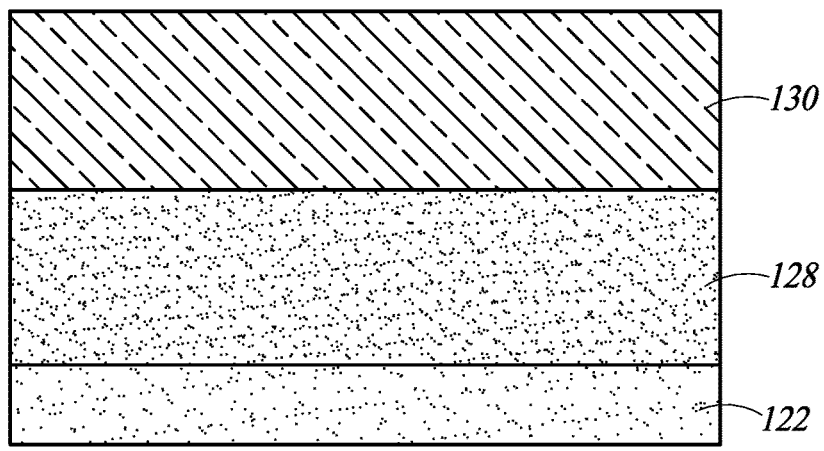
Figure 3C:
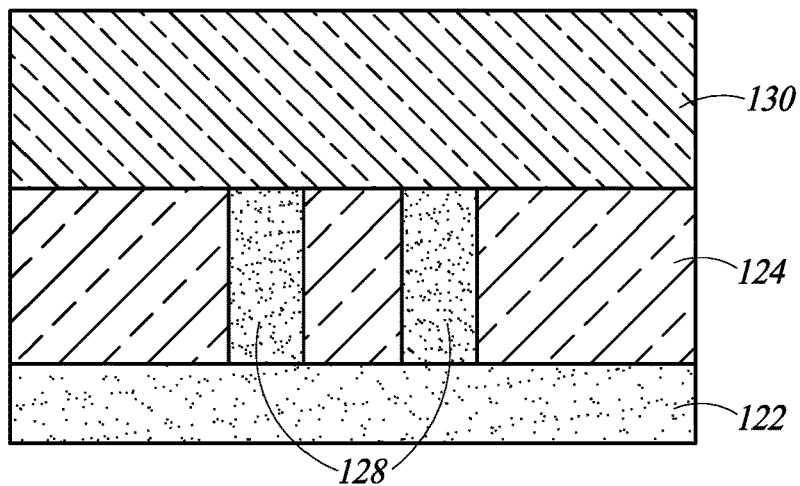
Figure 3D:
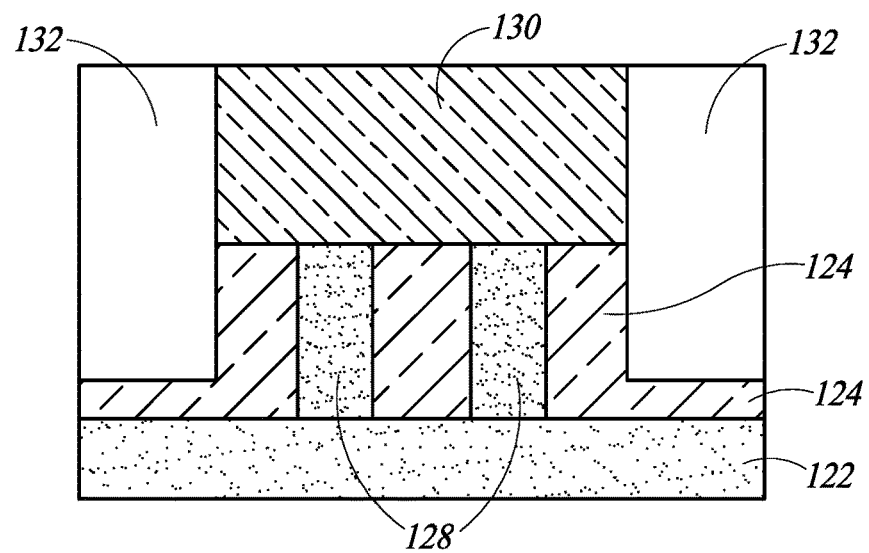

First, a via-first dual damascene process is performed to create via openings 132. The via openings 132 are etched through the second insulating layer 130 and partially into the first insulating layer 124, as shown in FIGS. 3A and 3D. A short channel trench 136 is then etched into the second insulating layer 130, using a RIE process, to define a short channel fin. Like the long channel trenches 126, the short channel trench 136 desirably has a widths in the range of about 5-20 nm, and more desirably, between 7-10 nm. The depth d of the short channel trench 136 created by the RIE process may be controlled by an advanced process control (APC) scheme so as to result in a short channel fin height h within the range of about 80-120 nm. A thickness t of the second insulating layer 130, shown in FIGS. 4B and 4D, remains to provide physical and electrical isolation between the long and short channel epitaxial fins 128 and 138, respectively, and to protect the long channel epitaxial fins 128 from dishing during downstream processing. The thickness t of the remaining insulating layer is targeted to be within a range of about 30-60 nm.

Figure 4A:
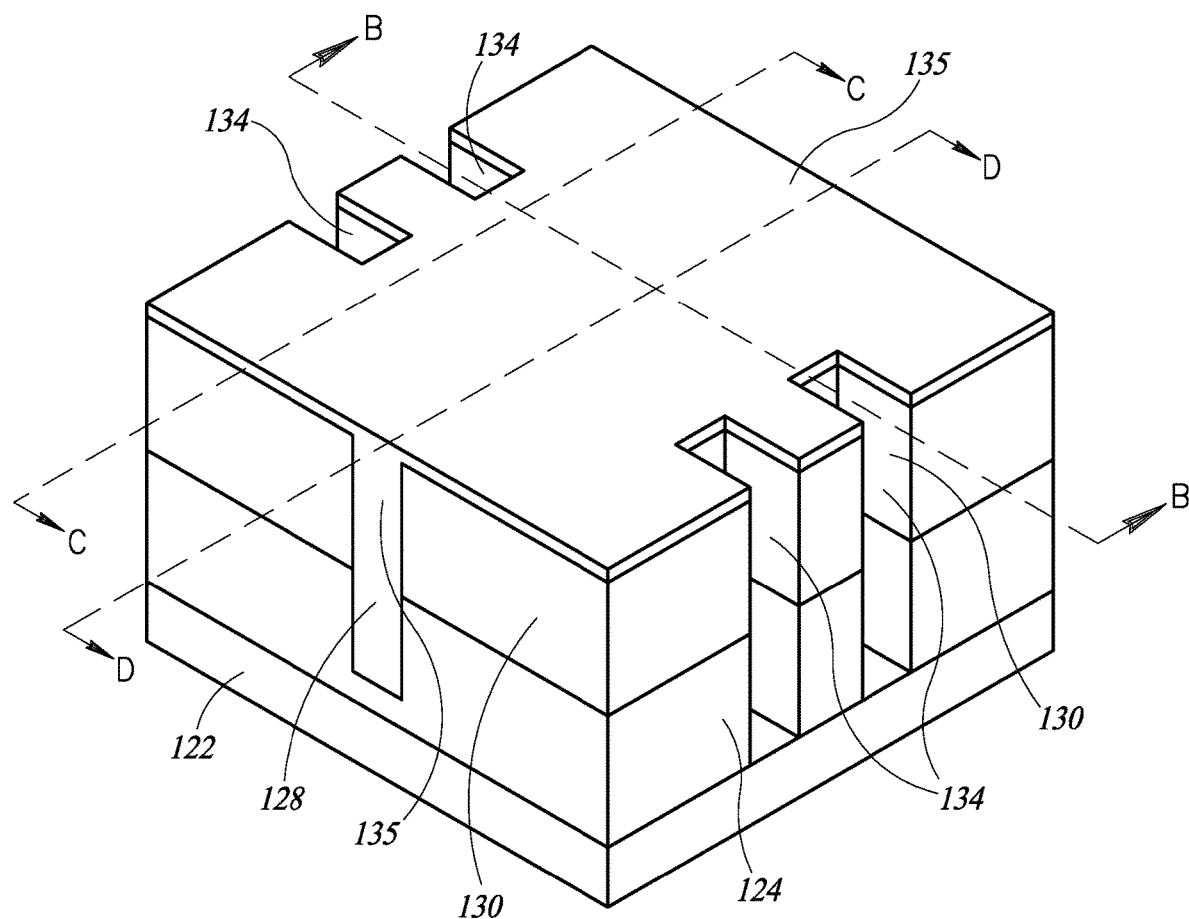
FIGS. 4A-4D show a perspective view and three different cross-sectional views of the integrated circuit cell after forming a trench for the short channel fin and source and drain region trenches for the long channel devices.
Figure 4B:
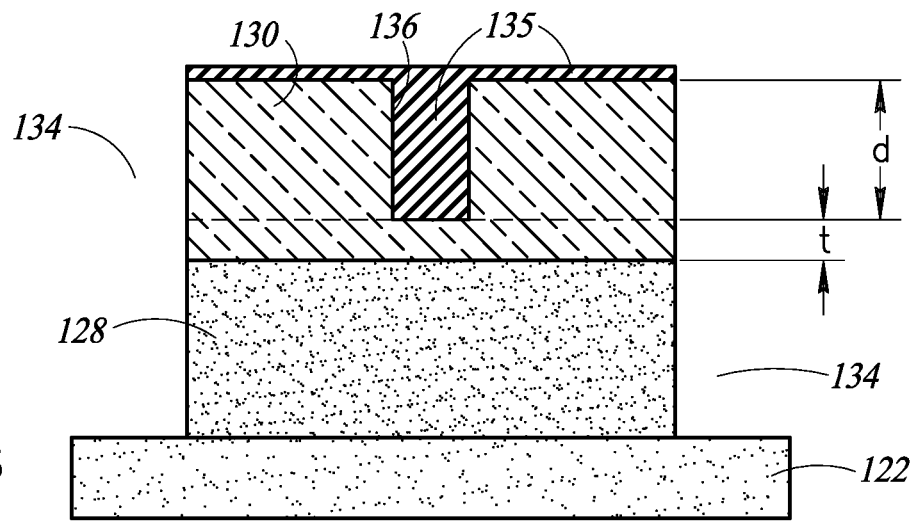
Figure 4C:
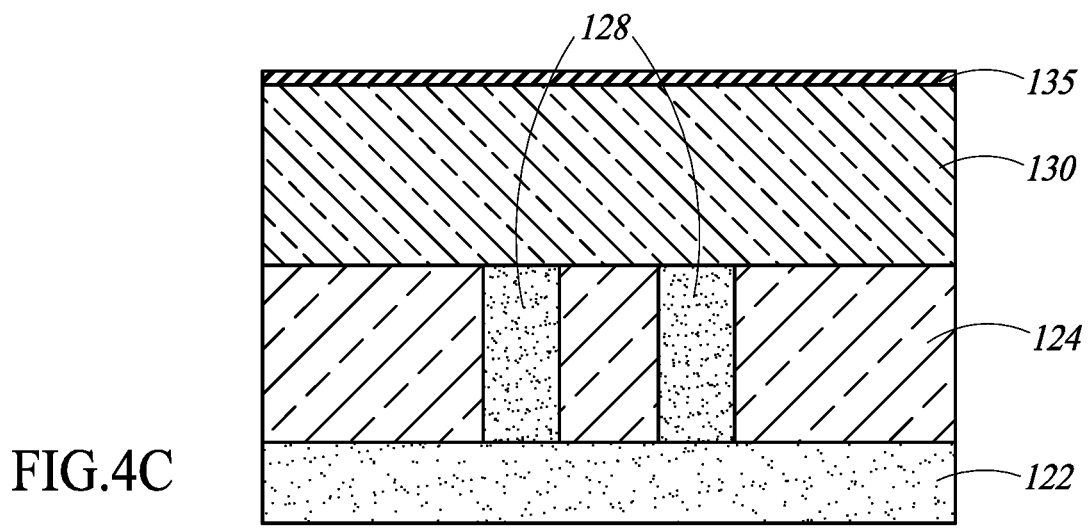
Figure 4D:
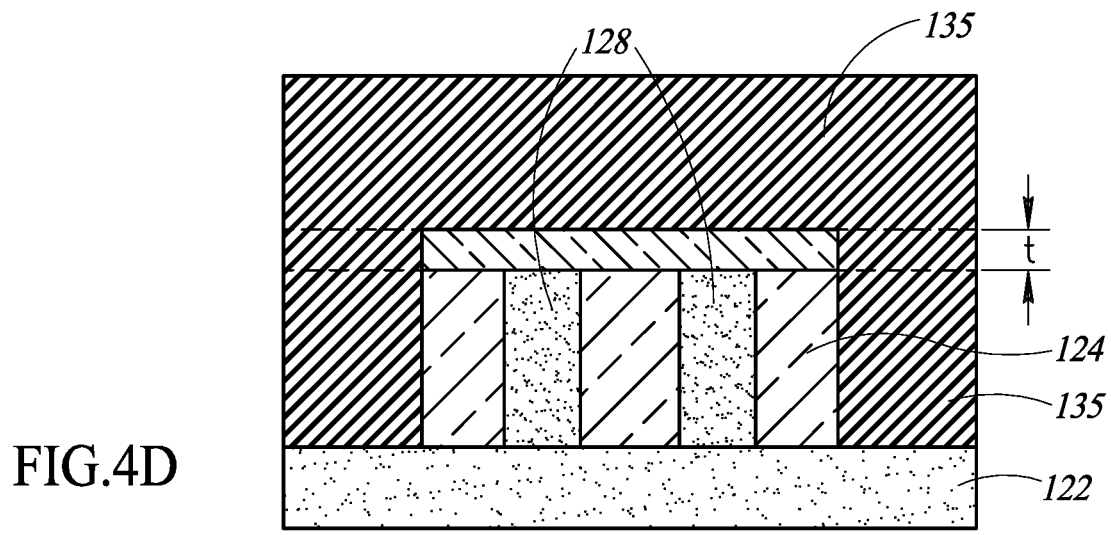
Figure 5A:
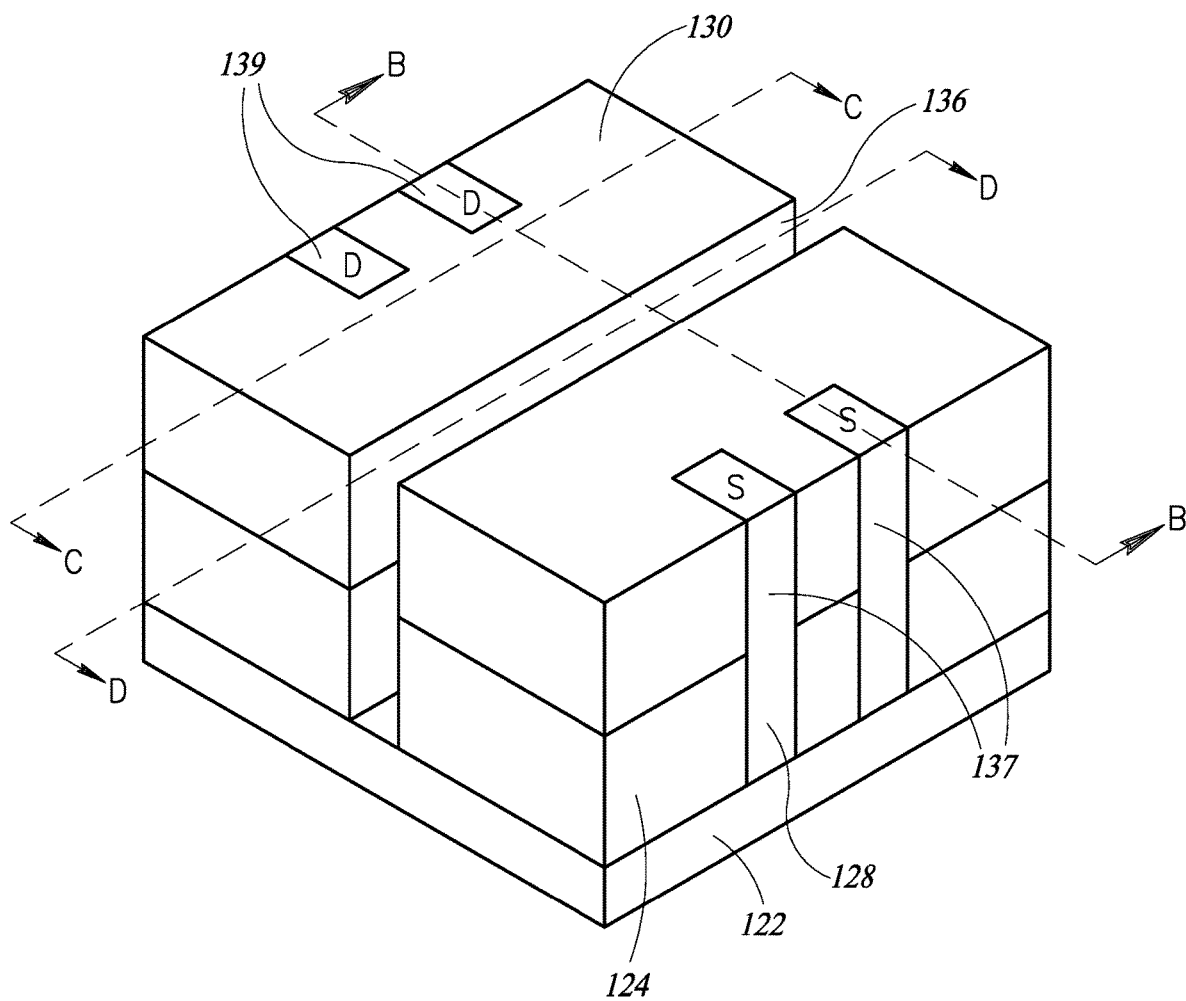
FIGS. 5A-5D show a perspective view and three different cross-sectional views of the integrated circuit cell following epitaxial growth and in-situ doping of the long channel source and drain regions.
Figure 5B:
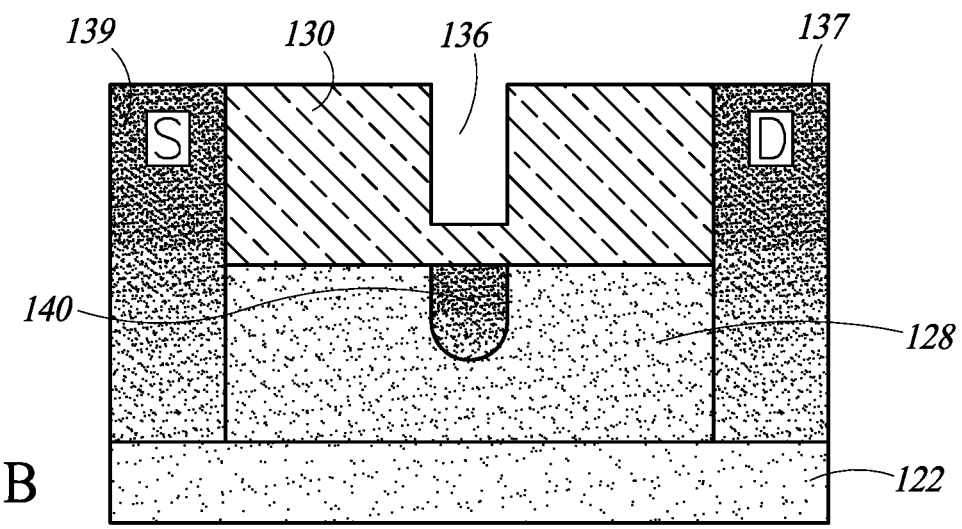
Figure 5C:
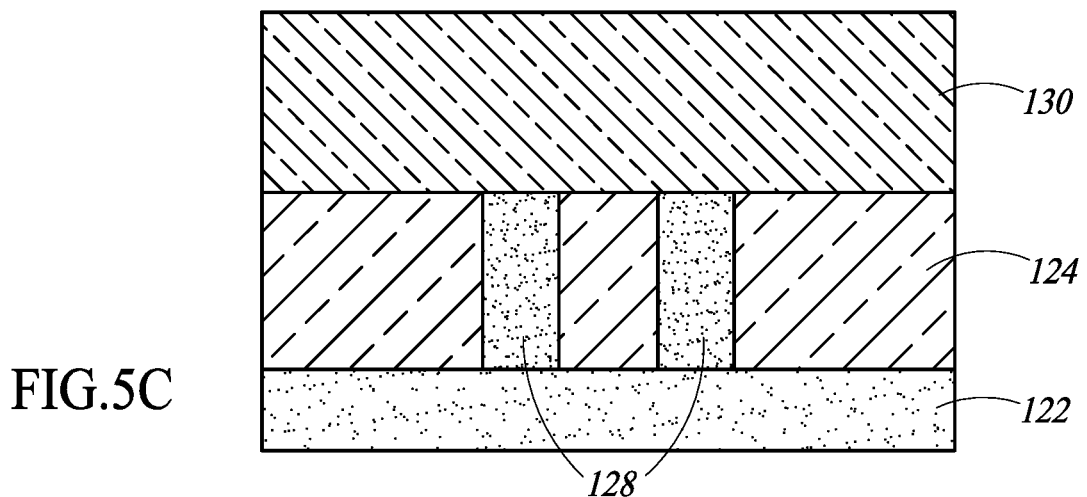
Figure 5D:
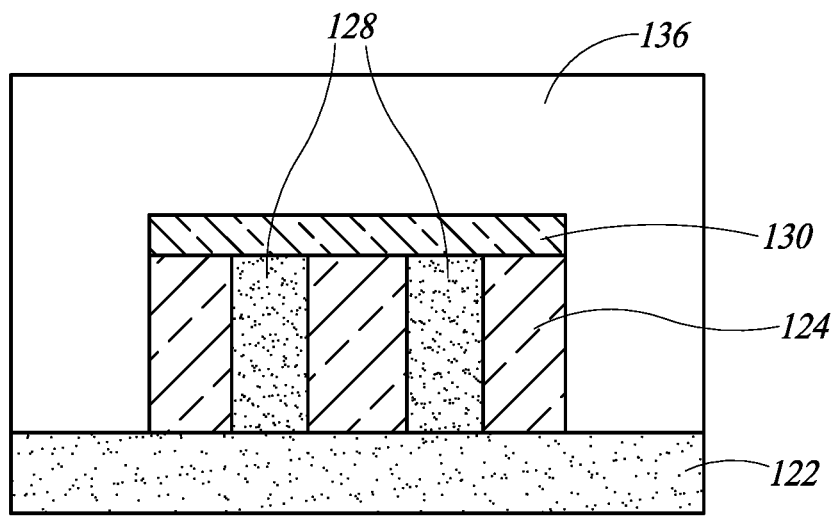
Figure 6A:
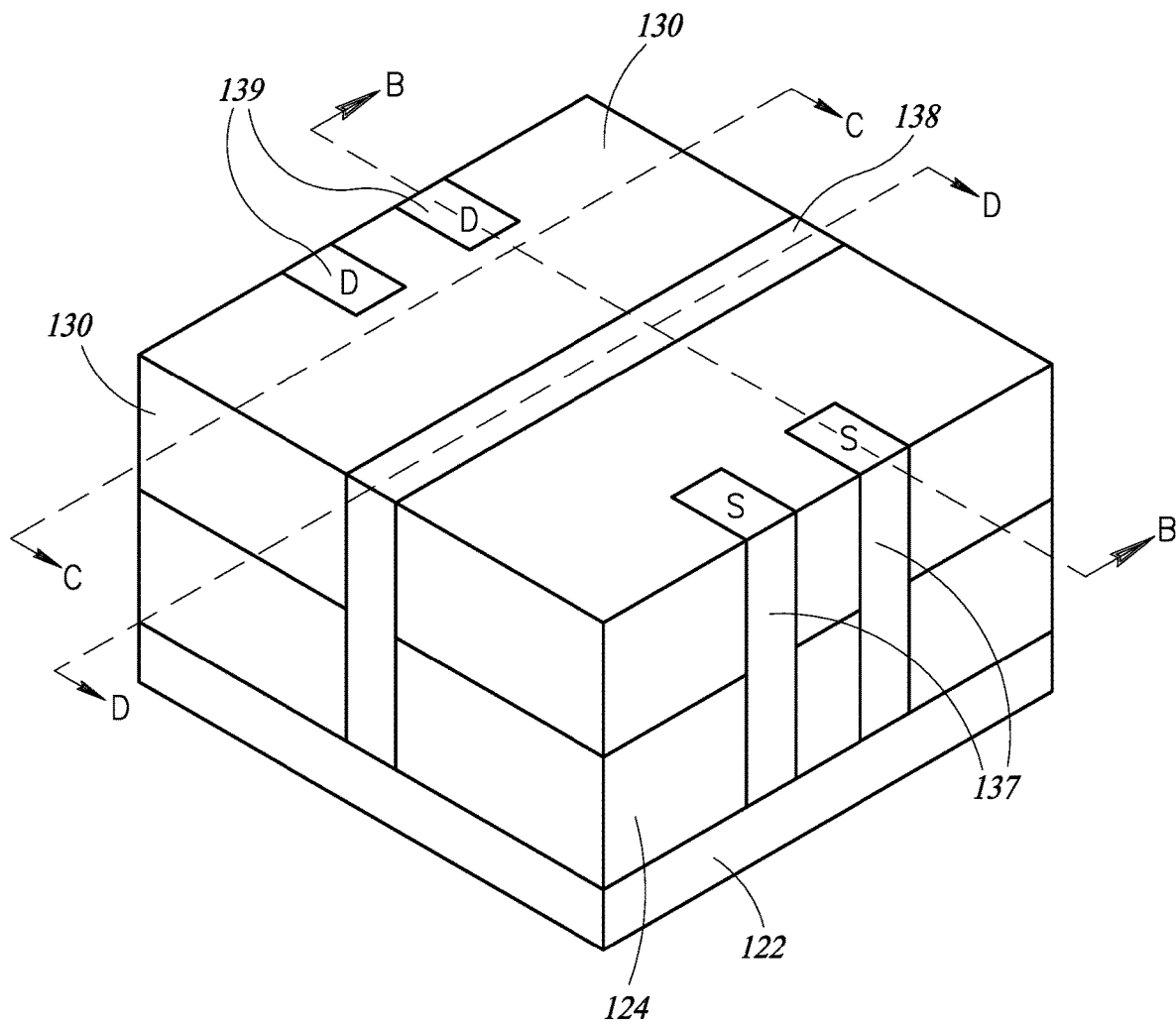
FIGS. 6A-6D show a perspective view and three different cross-sectional views of the integrated circuit cell following epitaxial growth of the short-channel fin.
Figure 6B:
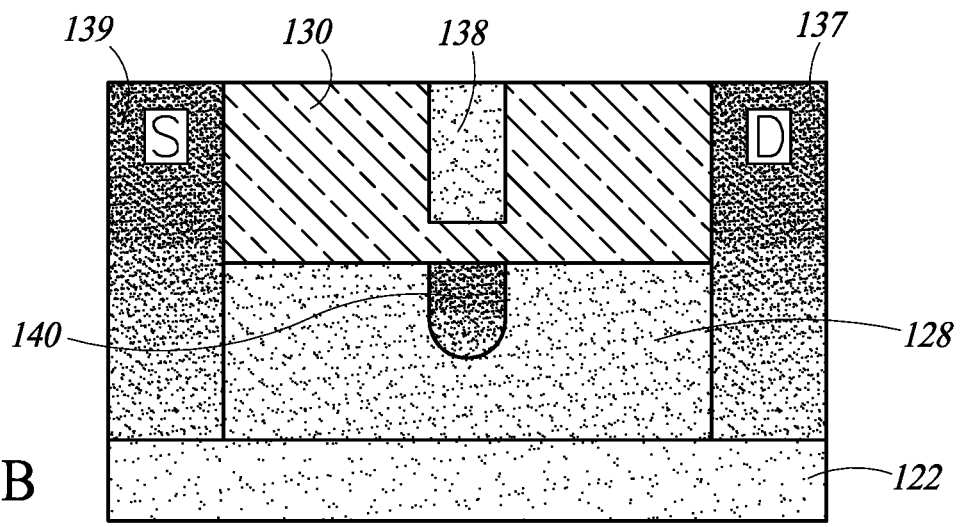
Figure 6C:
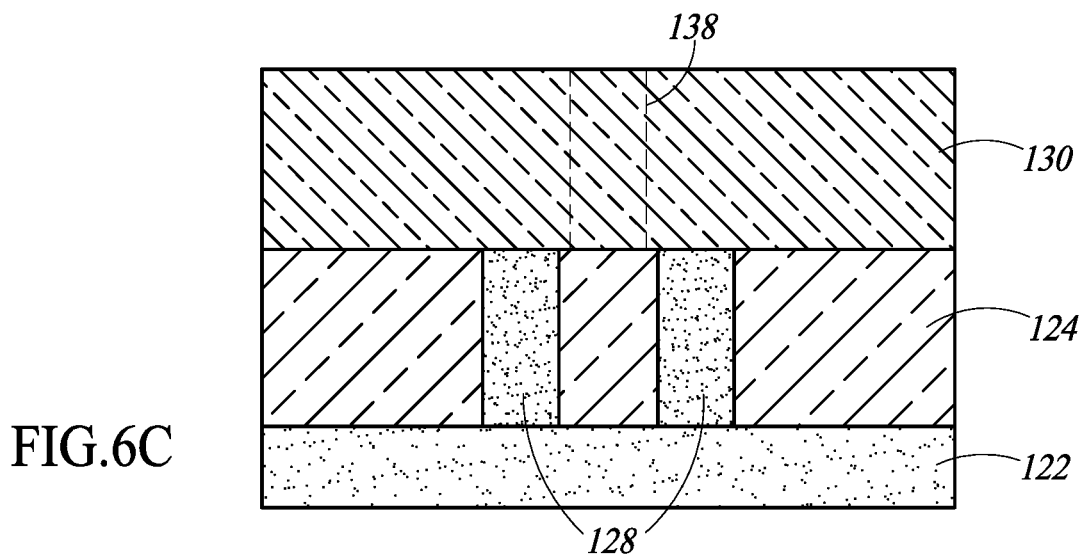
Figure 6D:
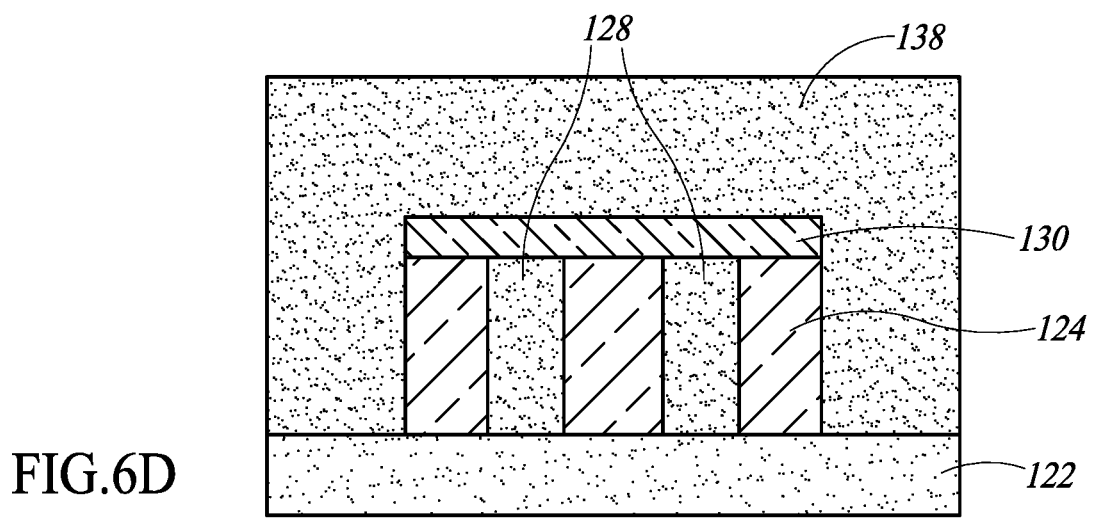

Next, the short channel trench 136 is filled with a blocking mask material 135. The blocking mask material 135 is deposited so as to fill the short channel trench 136 temporarily, and further to seal off the short channel trench 136 by forming a layer on top of the second insulating layer 130. The blocking mask material 135 therefore covers a portion of the top surface of the cell 120 to define locations of the long channel source and drain regions 137, 139. The blocking mask material 135 is desirably a material other than oxide, such as polysilicon or silicon nitride (SiN) that can later be removed using a chemical process that is highly selective to the surrounding second insulating layer 130, e.g., oxide. With the blocking mask material 135 in place, single damascene trenches 134 can be opened above the ends of the long channel epitaxial fins 128 as shown in FIGS. 4A and 4B. Then, epitaxial silicon can be grown in the trenches 134 to form source and drain regions 137 and 139, respectively, of the long channel transistors. If desired, the source and drain regions 137, 139 can be doped in-situ during the epitaxy process.

Following the long channel source/drain epitaxy process, the blocking mask material 135 is stripped, according to one embodiment as shown in FIGS. 5A-5D. The blocking mask may be stripped using, for example, a wet etch chemistry that attacks the blocking mask material, having a high selectivity to oxide. For example, if the blocking mask is made of SiN, the wet etch chemistry used to strip the blocking mask may be phosphoric acid. Once the blocking mask is removed from the short channel trench 136, a through-oxide implant step can be used to dope the underlying long channel epitaxial fins 128 to adjust the threshold voltage of the long channel transistors. The through-oxide implant step drives dopants through the thickness t of the second insulating layer 130 to form an implant-doped region 140 in the epitaxial fins 128, slightly below the floor of the short channel trench 136.

Finally, epitaxial silicon can be grown in the short channel trench 136 to form a short channel epitaxial fin 138 as shown in FIGS. 6A-6D. The epitaxial silicon fills the short channel trench 136 and is then planarized to stop on the second insulating layer 130, thus concluding formation of the short channel epitaxial fin 138.

Figure 7A:
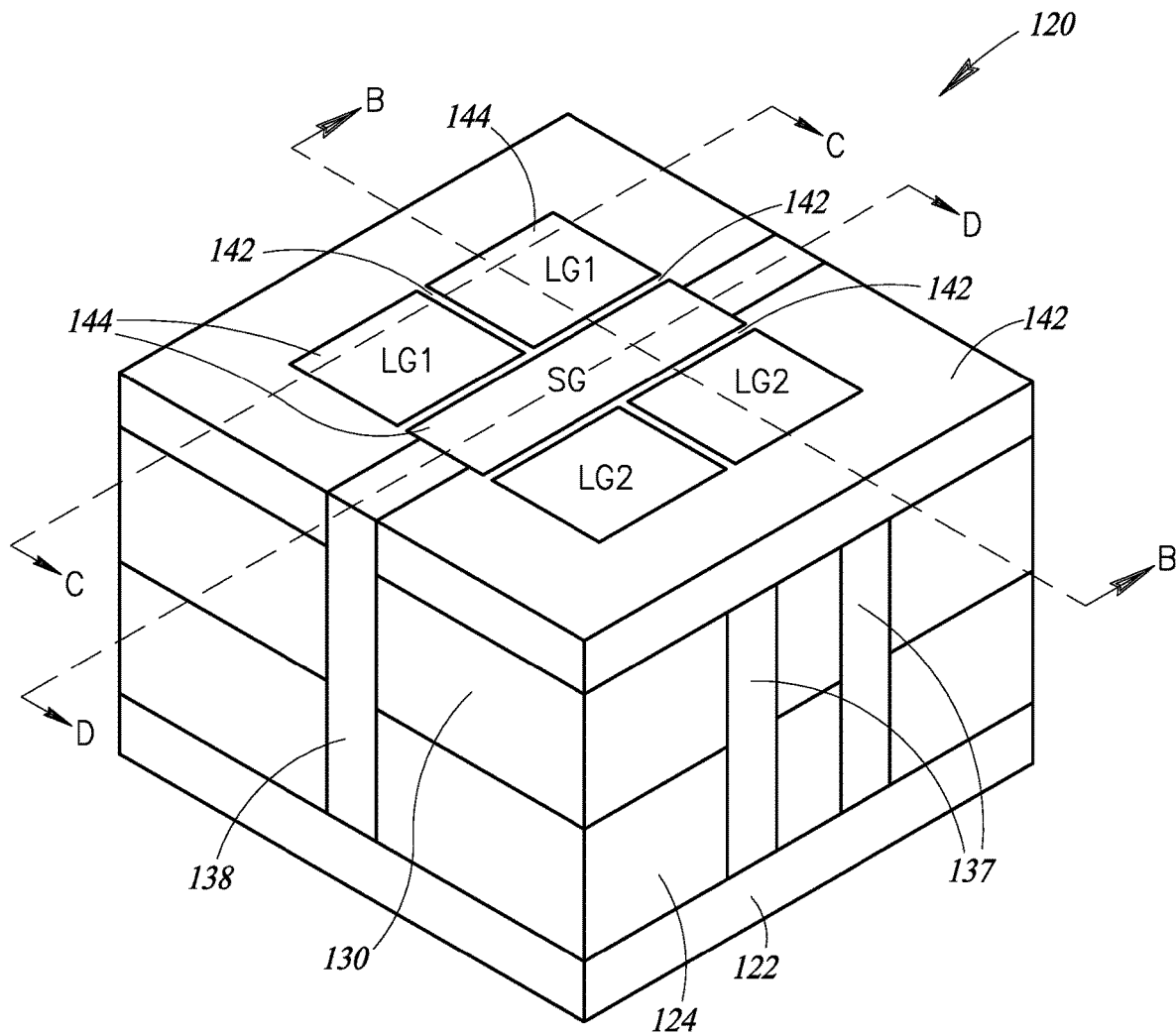
FIGS. 7A-7D show a perspective view and three different cross-sectional views of the integrated circuit cell during formation of source and drain regions for the short channel device.

At 106, source and drain regions 137, 139 of the long channel transistors can be further doped by implantation, while gate regions are covered by a multi-gate mask 144, according to one embodiment, as shown in FIGS. 7A-7D. FIG. 7A shows the integrated short and long channel cell 120 in which the multi-gate mask 144 covers long channel gate regions LG1 and LG2 and a short channel gate region SG while exposing long channel source and drain regions 137, 139, short channel source region 146, and short channel drain region 148. It is noted that, associated with each one of the long channel epitaxial fins is a pair of gates LG1 and LG2. Thus, the long channel transistors are multi-gate devices. The multi-gate mask 144 is desirably a hard mask that includes one or more of polysilicon and SiN. The multi-gate mask 144 may provide contiguous coverage of the gate regions, or the mask coverage may be separated into different rectangular regions for each of the gates.

Figure 7B:
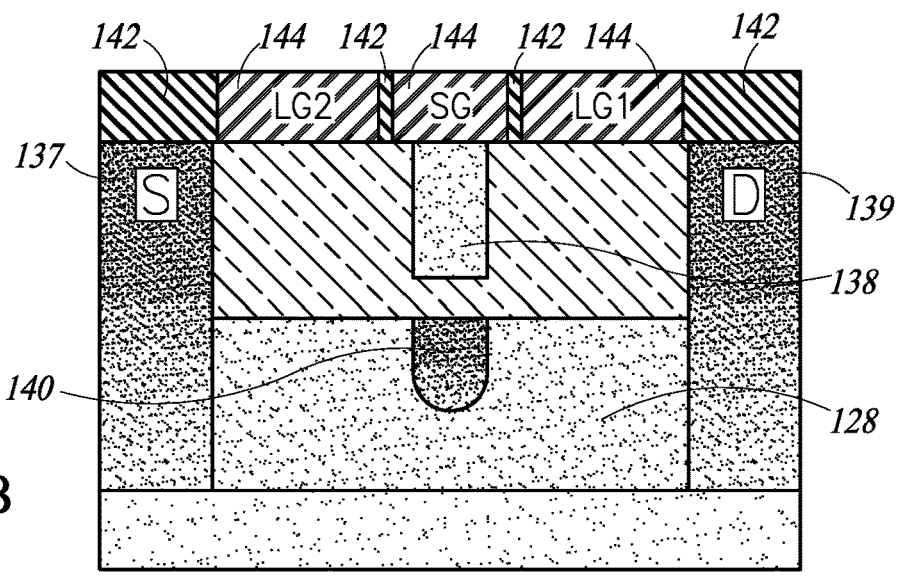
Figure 7C:
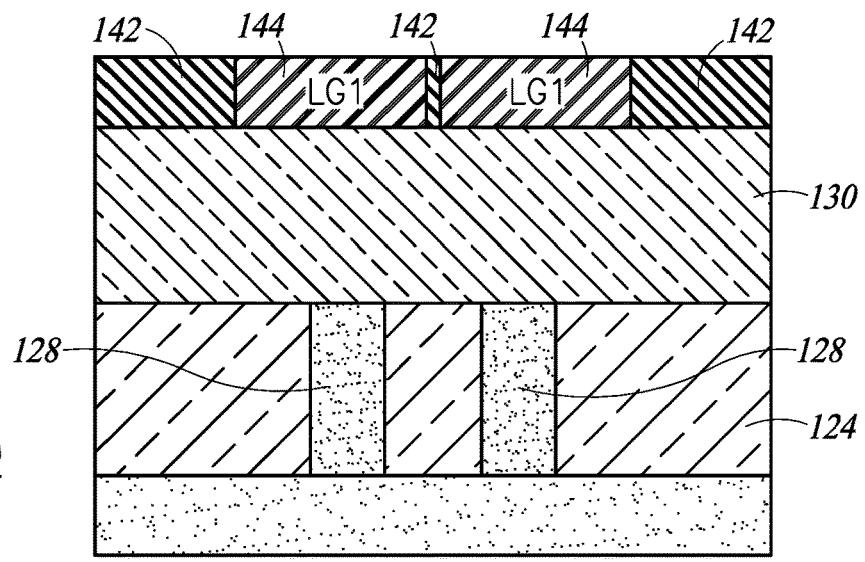
Figure 7D:
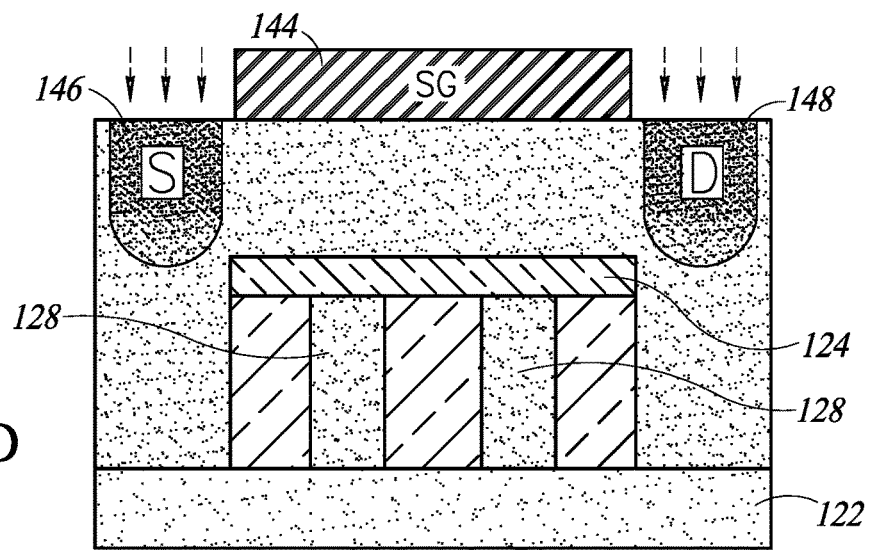
Figure 8A:
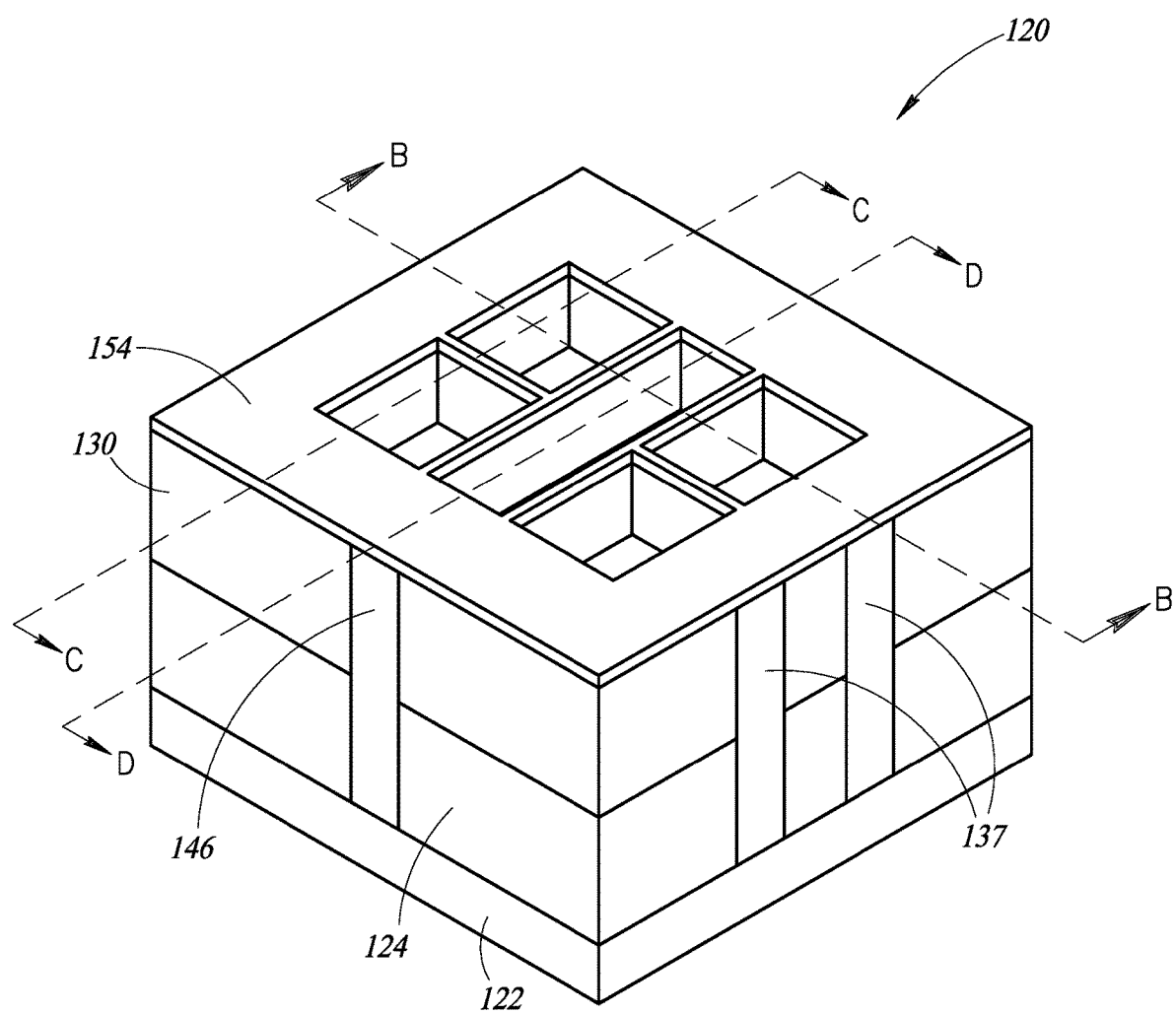
FIGS. 8A-8D show a perspective view and three different cross-sectional views of the integrated circuit cell after forming trenches for the gates.
Figure 8B:
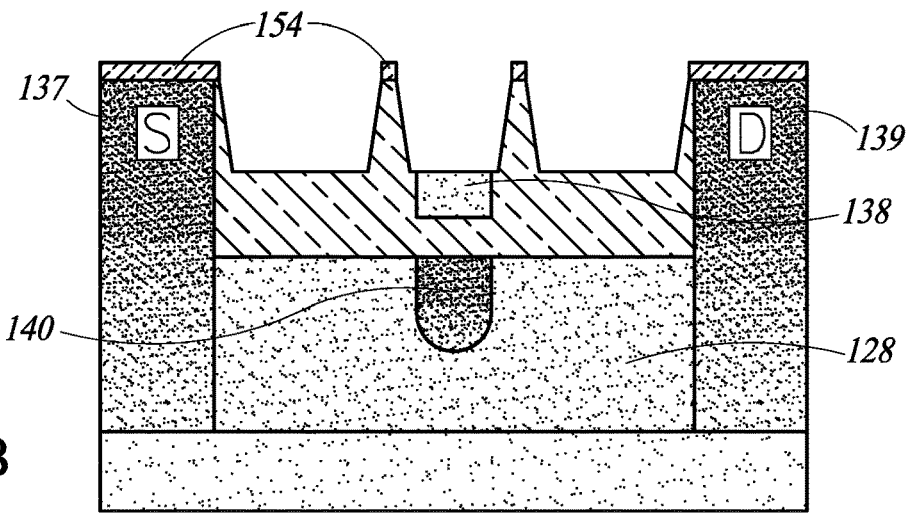
Figure 8C:
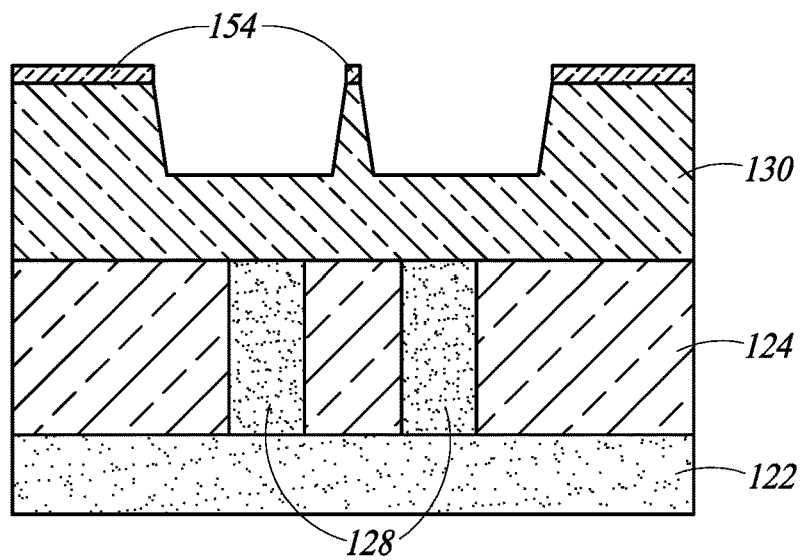
Figure 8D:
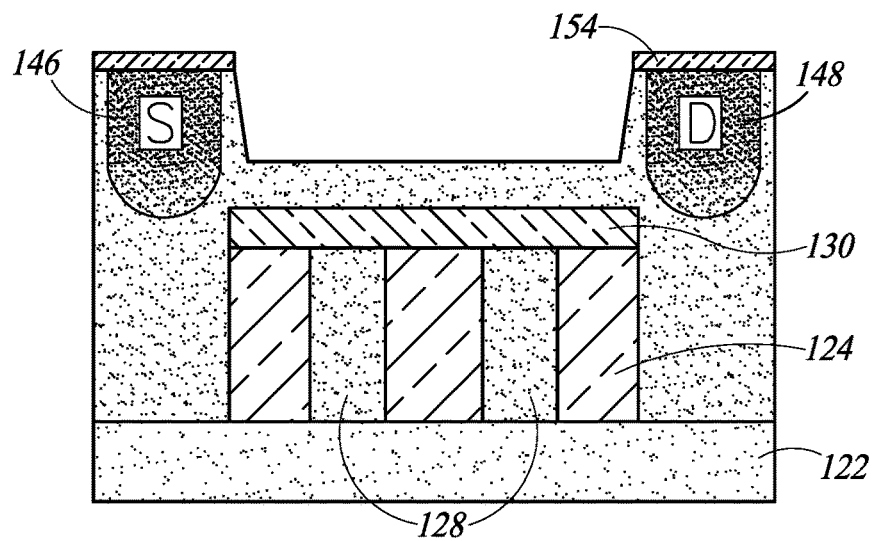

With the multi-gate mask 144 in place, the long channel and short channel source and drain regions 146, 148 are serially implanted with dopants as shown in FIGS. 7A, 7B, and 7D; e.g., boron for a p-type device, or phosphorous and/or arsenic for an n-type device. A first implant photoresist mask (not shown) can be used to cover the short channel source and drain regions 146, 148, while the long channel source and drain regions receive deep implants as shown in FIG. 7B. Then, the first implant photoresist mask is stripped and replaced with a second implant photoresist mask 142, shown in FIGS. 7A-7C, to cover the long channel source and drain regions 137, 139 while the short channel source and drain regions 146, 148 receive shallow implants as shown in FIG. 7D. The long channel source and drain regions 137, 139 extend downward through the long channel epitaxial fin 128 into the silicon substrate 122, while the short channel source and drain regions 146, 148 need only extend downward through the short channel epitaxial fin 138 into the first insulating layer 124. The second implant photoresist mask 142 is then stripped while leaving the multi-gate mask 144 in place.

At 108, self-aligned gate recesses are formed according to one embodiment as shown in FIGS. 8A-8D. A low-temperature TEOS hard mask 154 is initially deposited to cover the entire surface of the integrated short and long channel cell 120. The TEOS hard mask 154 is then planarized using the multi-gate mask 144 as a CMP stop layer. When the CMP process exposes the surface of the multi-gate mask 144, the long channel recessed gate regions LG1 and LG2 and the short channel recessed gate region SG are formed in a self-aligned manner by etching through the SiN multi-gate mask 144. Etching the recessed gates can be performed using an RIE chemistry that attacks SiN, the underlying insulating layer, and silicon, with selectivity to the TEOS hard mask 154. The recessed gates are initially etched to a same depth using advanced process control (APC).

Figure 9A:
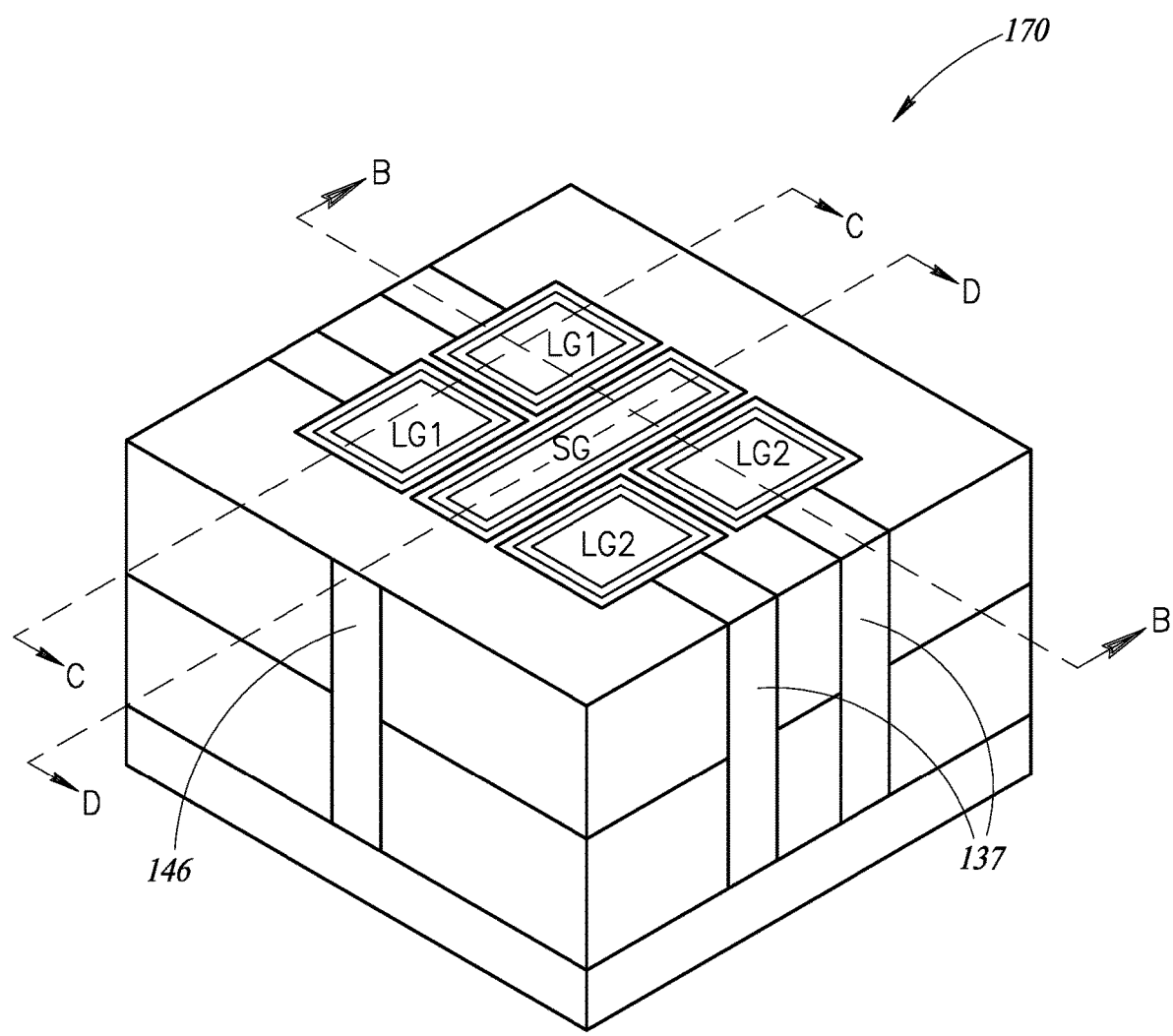
FIGS. 9A-9D show a perspective view and three different cross-sectional views of the integrated circuit cell after formation of the gates.
Figure 9B:
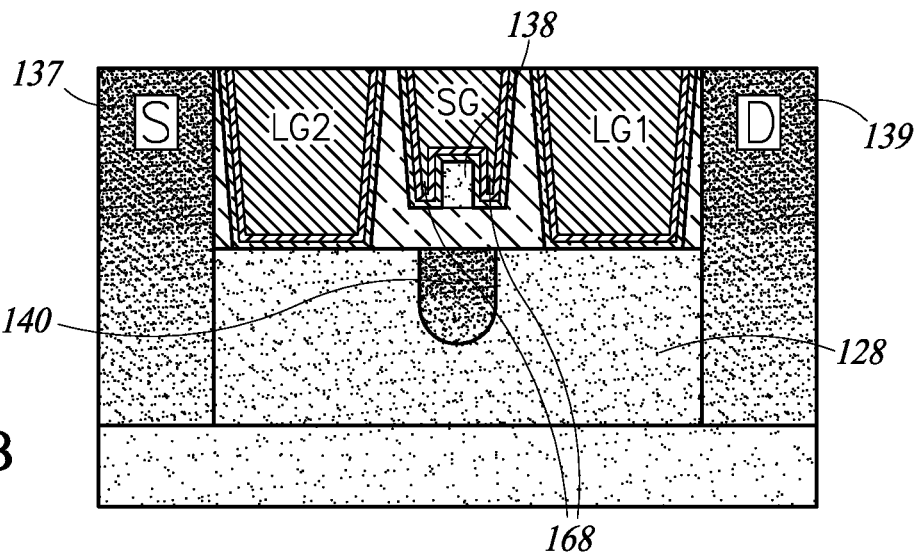
Figure 9C:
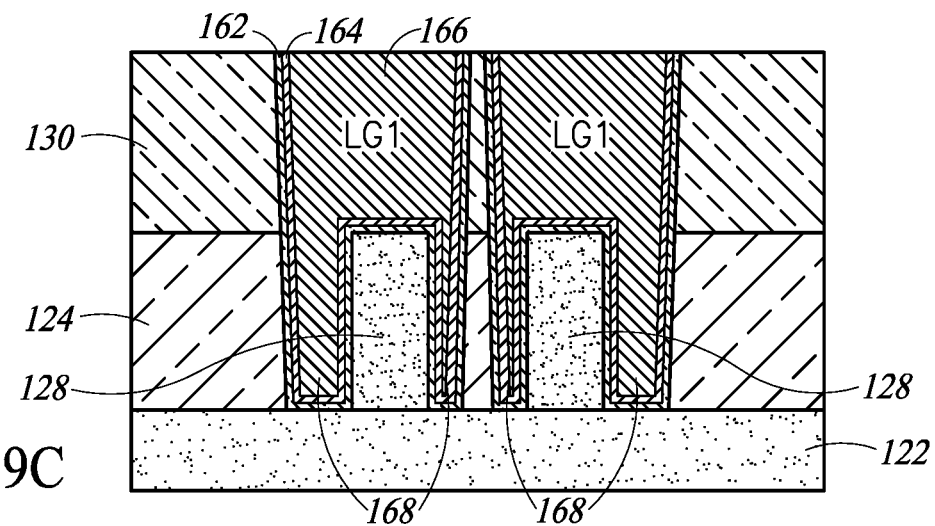
Figure 9D:
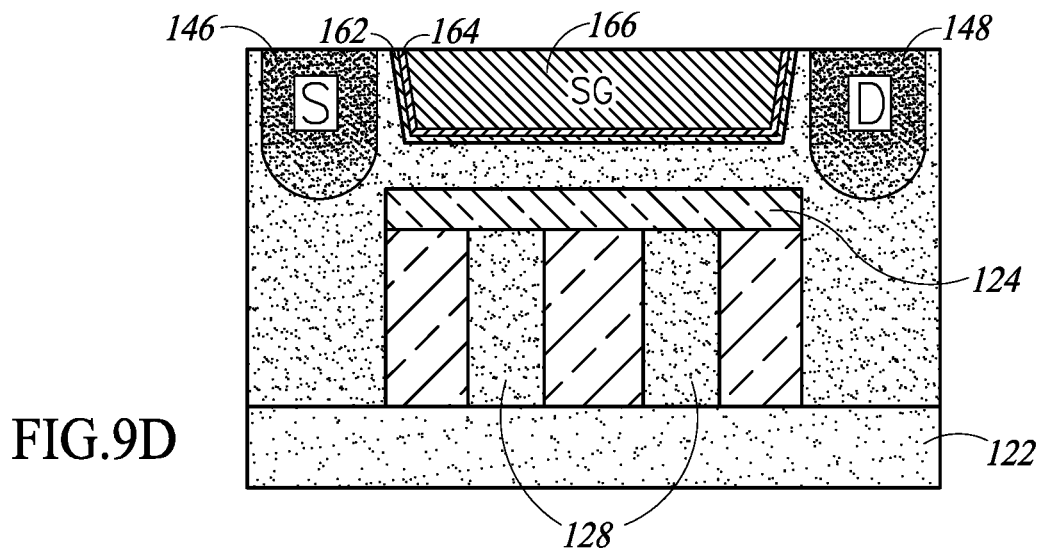

At 110, gate recess extensions 168 are formed to wrap around the fin sidewalls, according to one embodiment as shown in FIGS. 9A-9D. The gate recess extensions 168 can be formed by continuing the etching process using a RIE with an etch chemistry that removes $SiO_2$ of the first and second insulating layers 124, 130, selective to the epitaxial silicon in the fins 128, 138. While the short channel gate recesses only extend to wrap around three sides of the short channel epitaxial fins 138 as shown in FIG. 9B, the depths of the recesses for the long channel gates LG1 and LG2 are extended downward to wrap around three sides of the long channel epitaxial fins 128 as shown in FIG. 9C.

At 112, a gate dielectric 162, a metal liner 164, and a metal gate electrode 166 are formed in each of the gate recesses LG1, LG2, and SG according to one embodiment, as illustrated in FIGS. 9A-9D. It is noted that the metal gates of the short channel and the long channel devices are formed in the same layer. The gate dielectric 162 is deposited over the long channel and short channel epitaxial fins 128 and 138, respectively. The gate dielectric 162 can be a high-k gate dielectric material such as $SiO_2$, $HfO_2$ or the like, materials that are well known in the art. The metal liner 164 includes a work function material, e.g., titanium nitride (TiN) or titanium carbide (TiC). Alternatively, a separate work function material may be formed after the metal liner 164 is in place. The metal liner 164 and the metal gate electrode 166 can be made of materials that are commonly used in metal gate transistors, for example, TiN, and tungsten (W) or alloys containing tungsten, respectively. Once metal has been deposited into the recesses LG1, LG2, and SG to form the metal gates, the long channel and short channel gates are planarized using a second insulating layer 140 as a stop layer. The finished metal gates of the long channel and short channel devices thus have substantially co-planar top surfaces.

Figure 10A:
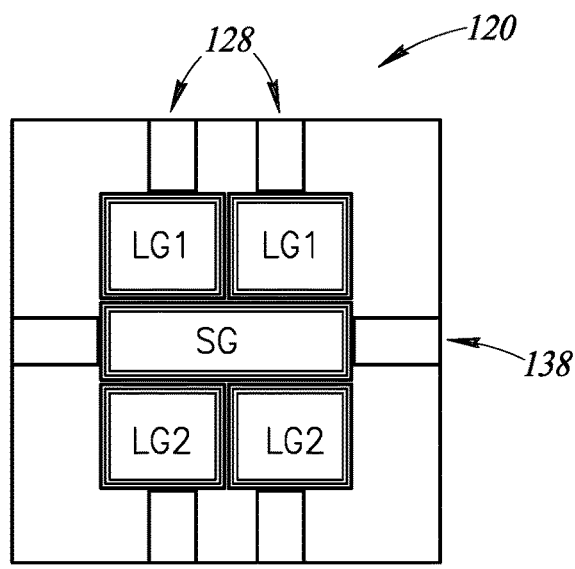
FIGS. 10A-10D show several exemplary cell embodiments that include different configurations and combinations of stacked short channel and long channel devices.
Figure 10B:
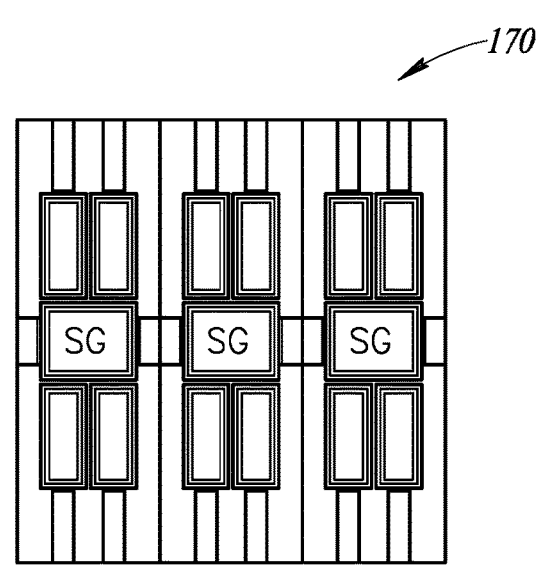
Figure 10C:
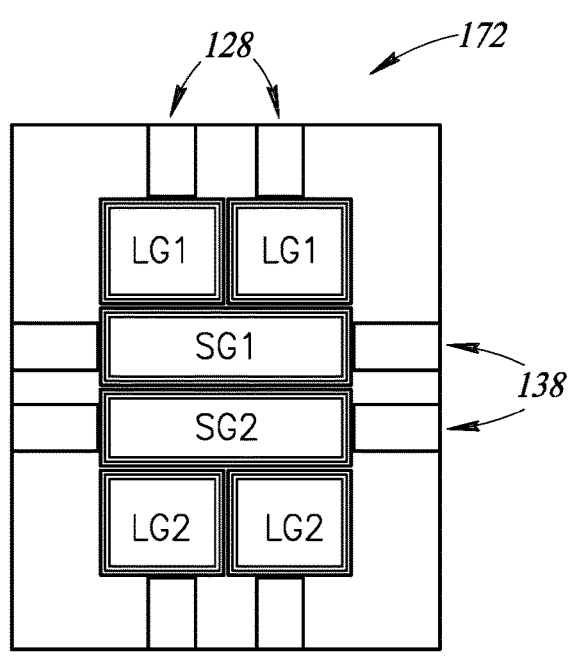
Figure 10D:
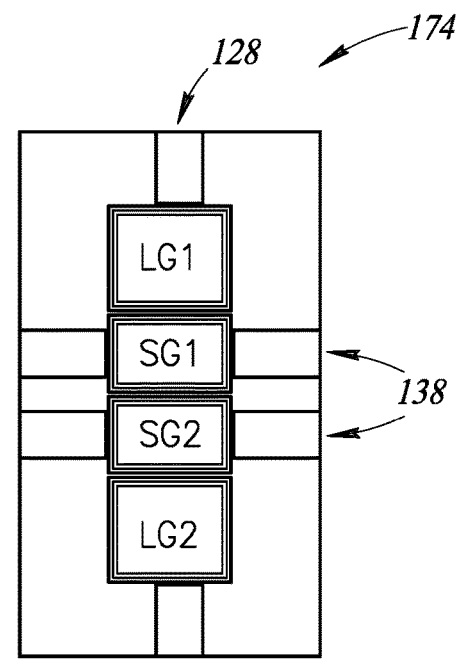

FIGS. 10B-10D show designs for integrated short and long channel cells according to various alternative embodiments, as exemplified in cells 170, 172, and 174, respectively. FIG. 10D reproduces the perspective view of the integrated short and long channel cell 120 for reference. In one example, a high density cell 170 features very short and very long channel devices arranged so that three pairs of long channel devices fit in the footprint of each cell 120, instead of one pair. Thus, the short channels within the high density cell 170 are three times shorter than the short channel within the cell 120. In other examples, a footprint of the high density cell 170 may be greater than or less than the footprint of the cell 120. In still other examples, cells 172 and 174 feature different numbers of short channel and long channel devices integrated into the same cell. For example, the cell 172 includes two long channel epitaxial fins 128 and two short channel epitaxial fins 138. The cell 174 includes two short channel epitaxial fins 138 and one long channel epitaxial fin 128, in which the gates of the short channel devices are co-linear with the gates of the long channel devices. Other cell configurations are possible in which different numbers or different sizes of long and short channel devices are integrated with one another.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:

1. A device, comprising:
a substrate;
a first semiconductor fin structure over the substrate, the first semiconductor fin structure oriented in a first lateral direction and including a first channel region;
a dielectric layer over the first semiconductor fin structure; and
a second semiconductor fin structure over the dielectric layer and the first semiconductor fin structure and at least partially overlapping the first semiconductor fin structure, the second semiconductor fin structure oriented in a second lateral direction that is different from the first lateral direction, and the second semiconductor fin structure including a second channel region.

2. The device of claim 1, wherein a length of the first semiconductor fin structure in the first lateral direction is larger than a length of the second semiconductor fin structure in the second lateral direction.

3. The device of claim 1, wherein the second semiconductor fin structure includes a middle portion and two vertical extension portions, the middle portion being over the first semiconductor fin structure, the two vertical extension portions being positioned by two opposite sides of the first semiconductor fin structure in the second lateral direction.

4. The device of claim 3, wherein a bottom surface of one or more of the two vertical extension portions of the second semiconductor fin structure is at a same level as a bottom surface of the first semiconductor fin structure with respect to the substrate.

5. The device of claim 1, further comprising a first gate structure adjacent to the first semiconductor fin structure, the first gate structure being positioned by a side of the second semiconductor fin structure in the first lateral direction.

6. The device of claim 5, wherein the first gate structure is adjacent to the first semiconductor fin structure by an upper surface of the first semiconductor fin structure and two side surfaces of the first semiconductor fin structure in the second lateral direction.

7. The device of claim 5, further comprising a second gate structure adjacent to the second semiconductor fin structure, the second gate structure being positioned over the first semiconductor fin structure and being separated from the first semiconductor fin structure by the dielectric layer.

8. The device of claim 1, wherein the first semiconductor fin structure includes a first region below the second semiconductor fin structure, the first region including a different doping characteristic from a second region of the first semiconductor fin structure.

9. A device, comprising:
a substrate;
a fin structure over the substrate, the fin structure including a first portion, a second portion and a third portion, the third portion being positioned between the first portion and the second portion in a first direction, the third portion including a doping region that has a doping characteristic different from that of the first portion and the second portion of the fin structure;
a first source/drain structure connected to the first portion;
a second source/drain structure connected to the second portion;
a first gate structure over the third portion and adjacent to the first portion; and
a second gate structure over the third portion and adjacent to the second portion, the second gate structure being laterally separated from the first gate structure by a semiconductor structure,
wherein the first source/drain structure and the second source/drain structure both extend downward until being at a same level as a bottom surface of the fin structure.

10. The device of claim 9, wherein the doping region extends from a first surface of the fin structure partially toward a second surface of the fin structure, the second surface of the fin structure being closer to the substrate than the first surface of the fin structure.

11. The device of claim 9, wherein the doping region is laterally between the first gate structure and the second gate structure.

12. The device of claim 9, wherein the first source/drain structure and the second source/drain structure are coplanar with the first gate structure and the second gate structure at respective upper surfaces.

13. A device, comprising:
a substrate;
a first semiconductor fin structure over the substrate and extending in a first lateral direction;
a dielectric layer over the first semiconductor fin structure;
a second semiconductor fin structure at least partially over the dielectric layer and at least partially overlapping the first semiconductor fin structure, the second semiconductor fin structure including a first portion and a second portion and a third portion arranged in a second lateral direction that crosses the first lateral direction, the third portion being over a first surface of the dielectric layer, the first and the second portions extending downwardly past the first surface of the dielectric layer toward the substrate; and
a gate structure adjacent to at least the third portion of the second semiconductor fin structure.

14. The device of claim 13, wherein the first and the second portions of the second semiconductor fin structure extend downwardly toward the substrate and past a surface of the first semiconductor fin.

15. The device of claim 13, wherein the second semiconductor fin structure is H-shaped.

16. The device of claim 13, wherein the first and the second portions of the second semiconductor fin structure are source/drain structures.

17. The device of claim 13, wherein the gate structure extends from over the third portion of the second semiconductor fin structure toward the substrate until coplanar to a surface of the third portion of the second semiconductor fin structure.

18. The device of claim 17, wherein the gate structure wraps around the third portion of the second semiconductor fin structure on three surfaces of the third portion.

19. The device of claim 13, wherein the substrate includes a protrusion portion extending away from the substrate toward the dielectric layer, the protrusion portion being under the dielectric layer.

20. A device, comprising:
a substrate;
a first fin structure of a first semiconductor material over the substrate, the first fin structure oriented in a first lateral direction;
a dielectric layer over the first fin structure;
a second fin structure of a second semiconductor material over the dielectric layer and the first fin structure, the second fin structure oriented in a second lateral direction that is different from the first lateral direction; and
a first gate structure adjacent to the first fin structure, the first gate structure being positioned by a side of the second fin structure in the first lateral direction,
wherein the first gate structure is adjacent to the first fin structure by an upper surface of the first fin structure and two side surfaces of the first fin structure in the second lateral direction.

21. The device of claim 20, wherein a length of the first fin structure in the first lateral direction is larger than a length of the second fin structure in the second lateral direction.

22. A device, comprising:
a substrate;
a first fin structure of a first semiconductor material over the substrate, the first fin structure oriented in a first lateral direction;
a dielectric layer over the first fin structure;
a second fin structure of a second semiconductor material over the dielectric layer and the first fin structure, the second fin structure oriented in a second lateral direction that is different from the first lateral direction;
a first gate structure adjacent to the first fin structure, the first gate structure being positioned by a side of the second fin structure in the first lateral direction; and
a second gate structure adjacent to the second fin structure, the second gate structure being positioned over the first fin structure and being separated from the first fin structure by the dielectric layer.

23. The device of claim 22, wherein the second fin structure is H shaped.

* * * * *